United States Patent [19]
MacDonald

[11] Patent Number: 5,818,216
[45] Date of Patent: Oct. 6, 1998

[54] MINIMALLY INVASIVE CURRENT SENSING CIRCUIT

[75] Inventor: Alistair M. MacDonald, Ville Neuve Loubet, France

[73] Assignee: Lucent Technologies Inc., Murray Hill, N.J.

[21] Appl. No.: 578,289

[22] Filed: Dec. 26, 1995

[30] Foreign Application Priority Data

Aug. 23, 1995 [EP] European Pat. Off. .............. 95401936

[51] Int. Cl.$^6$ .................................................. G01R 31/00
[52] U.S. Cl. ............................................ 324/96; 379/379
[58] Field of Search .................................. 324/96, 244.1, 324/126, 127; 379/379

[56] References Cited

U.S. PATENT DOCUMENTS

| | | | |
|---|---|---|---|
| 3,622,709 | 11/1971 | Tjaden | 179/18 F |
| 4,280,097 | 7/1981 | Carey et al. | 324/434 |
| 5,291,545 | 3/1994 | Stahl | 379/98 |
| 5,392,334 | 2/1995 | O'Mahony | 379/67 |

OTHER PUBLICATIONS

Kirkham H. et al., "Optically Powered Data Link for Power System Applications", IEEE Transactions on Power Delivery, vol. 4, No. 4, Oct. 1989 USA, pp. 1997–2004.

"Low Loss DC Current Sensing"; IBM Technical Disclosure Bulletin, vol. 31, No. 6, Armonk, NY, Nov., 1988, pp. 268–270.

Kiyoshi K. et al. "Optical Transmitting and Receiving Equipment"; Patent Abstracts of Japan, vol. 7, No. 13 (E–153) Jan. 19, 1983.

Patent Abstracts of Japan, JP–A–57 171855; Matsushita Denki Sangyo KK; Oct. 22, 1982.

European Search Report for EP 95 40 1936.

*Primary Examiner*—Vinh P. Nguyen
*Assistant Examiner*—Russell M. Kobert

[57] ABSTRACT

A minimally invasive detection circuit for determining whether a current flow is present in an electrical conductor, such as a telephone line, without appreciably loading the conductor. A load is placed in series with the conductor to generate a voltage drop when current flows therethrough. The voltage drop is detected by powered components that provide a signal, across an electrical isolation barrier, to an electrically isolated output. The powered components are powered by a voltage source that is on the isolated or remote side of the isolation barrier and whose voltage output is provided to the powered components across the isolation barrier so as to maintain electrical isolation between the powered components and the output and thereby avoid unnecessary loading of the conductor.

9 Claims, 1 Drawing Sheet

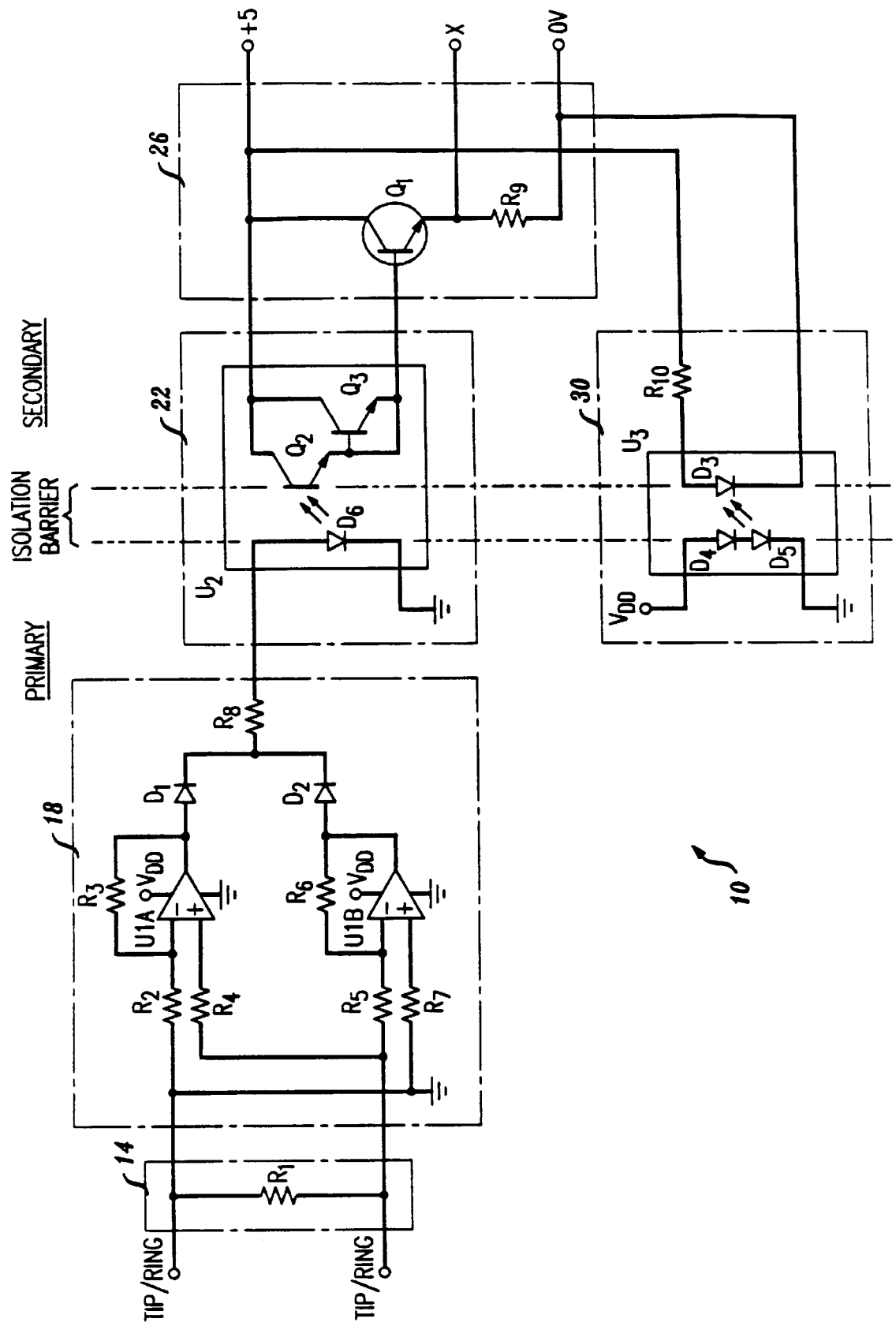

MINIMALLY INVASIVE CURRENT SENSING CIRCUIT

BACKGROUND OF THE INVENTION

I. Field of the Invention:

This invention broadly relates to apparatus for measuring the current flow in an electrical conductor while minimizing the load placed thereon. More particularly, the present invention is directed to a minimally invasive circuit for use by or in conjunction with terminal devices in a telephone communication system having more than one such terminal device connected to a common telephone line, for detecting current flow in the telephone line (which occurs when one of the terminal devices is in use) and for signaling to the other terminal devices that the telephone line is unavailable for their use.

II. Discussion of Background Art:

In telephone communication systems, an electric current flows through the tip and ring conductors of a telephone line when a terminal device, such as an answering machine, facsimile machine or telephone, that is connected to the line is in use. In many circumstances it is desirable for more than one device or piece of terminal equipment to be connected to and thus share a common line. However, some systems—such as those used in Germany and Austria—prohibit the concurrent connection of multiple devices to a common line unless certain safeguards are in place to ensure that only one device on the line is in use at any given time. For example, if a telephone and an automatic terminal device such as a facsimile machine or modem are connected to the same line, it is desirable and, for some systems mandatory, that when the telephone is in use the facsimile machine or modem will be unable to use or access the line to send outgoing data, as this would interfere with the ongoing use of the telephone and potentially damage elements of the system.

Several techniques are currently known for ensuring that only one of several pieces of terminal equipment that share a common line can be used at a given time. The most basic technique is to simply disconnect all but the single device in use; such a manual task is, however, extremely inconvenient. Another is to use a highly sensitive electromagnetic switch, such as a reed relay, for sensing current flow in the line when a terminal device is in use and for activating other circuitry so as to render the line inaccessible to the remaining devices by automatically disconnecting those other devices. Still another technique employed to ensure that only a single terminal device occupies a line at any given time is to use a bidirectional optocoupler which detects current flow in the line, on a primary side of a circuit, and to signal to a sensor or microprocessor located across an isolation barrier on a secondary side of the circuit that the line is in use. Upon receipt of the signal, the sensor or microprocessor operatively renders the other devices sharing the line inoperative until the line is free.

The power and load specifications of all terminal devices are typically dictated or limited by the particular communication systems on which such devices operate. The same is true with respect to techniques employed by terminal devices to detect activity in the lines of communication systems, such as to determine if a common line is in use by a terminal device. In telephone communication systems employed in the United States, most of the heretofore known current detection techniques, including those discussed above, may be readily used because these techniques comply with the load specifications of such systems. However, the specifications of some other telephone communication systems, such as those presently in use in Germany and Austria, do not allow the use of all current measuring techniques or devices because the load created by such measuring devices and/or the power needed for their operation exceed or are inconsistent or otherwise do not comply with the specifications of such systems.

For example, a standard bidirectional optocoupler will create a voltage drop on the line of approximately 1.2 volts, thus rendering such devices unsuitable for current detection in the systems used in Germany and Austria. In addition, although very sensitive reed relay switches—which cause a series resistance in the line of approximately 10 ohms—may be used for line current detection when bidirectional optocouplers cannot be employed, such devices are costly, relatively large and unavailable in surface mount technology. Accordingly, it would be desirable to have a line current detection device which alleviates the problems associated with prior art detection devices by detecting current flow in a conductor line in a minimally invasive manner, i.e. without drawing a significant current or voltage in the conductor, without causing an undue load on the conductor and while maintaining the necessary safety requirements.

SUMMARY OF THE INVENTION

The present invention provides a minimally invasive arrangement for sensing current flow in an electrical conductor, and particularly in a conductor such as a telephone line wherein electrical isolation must be maintained between the telephone line and terminal equipment connected to the line.

The invention is embodied in a circuit that includes a load connected in series with the conductor for developing a voltage differential across the load when current flows through the conductor. Powered means are provided for sensing a change in the voltage differential across the load and for generating a sensing signal in response to that change. The circuit has an output which is electrically isolated from the load and the sensing means and which is positioned across an electrical isolation barrier that defines a primary side including the load and the sensing means, and a secondary side including the output. The isolation barrier thus separates the primary and secondary sides to prevent direct electric contact therebetween. Communicating means are provided for conveying the sensing signal to the output while maintaining electrical isolation between the sensing means and the output. The communicating means is driven by an operating voltage obtained from the secondary side of the circuit. Means driven by the operating voltage is also provided for powering the sensing means while maintaining electrical isolation between the supply means and the sensing means by communicating the operating voltage to the sensing means across the isolation barrier.

In the currently preferred embodiment, the load is a resistor, the driving means is a photodiode array and the providing means is an optocoupler.

As currently contemplated, the circuit is most typically intended for incorporation in automatic terminal equipment, such as a facsimile machine or modem, which shares a common telephone line with like and other terminal devices such as a telephone. To avoid disturbing or interfering with the use of the telephone by attempting to utilize another terminal device while the telephone is off-hook, the circuit will first test the line to determine whether current is flowing therethrough—indicating an in-use or off-hook condition. If current flow is detected, the circuit renders the not-in-use terminal devices, which are responsive to the output of the circuit, inaccessible to the line until such current flow has ceased or is no longer detected.

While the circuit arrangement of the present invention has particular utility in telephone communication systems, it is also contemplated that it be used in or with other types of sensitive electrical equipment, such as medical devices, which may share a common conductor or line.

If no load is included, the circuit becomes a simple voltage comparator which may have additional applications as well.

Other objects and features of the present invention will become apparent from the following detailed description considered in conjunction with the accompanying drawing. It is to be understood, however, that the drawing is designed solely for purposes of illustration and not as a definition of the limits of the invention, for which reference should be made to the appended claims.

BRIEF DESCRIPTION OF THE DRAWING

The single FIGURE is a schematic representation of a line current detector constructed in accordance with the teachings of the present invention.

DETAILED DESCRIPTION OF THE PREFERRED EMBODIMENT

The utility and operation of the inventive line current detector will, for convenience, be described in the context of a telephone communication system and, specifically, with respect to one of a possible plurality of terminal equipment devices connected to a telephone line. It should be readily understood, however, that the circuit may correspondingly be employed to detect a flow of current or the presence of a voltage in a variety of other applications.

A schematic representation of a minimally invasive line current detector circuit 10 constructed in accordance with the present invention is illustrated in the FIGURE. As there shown, the circuit 10 has a primary section that is electrically isolated from a secondary section by an isolation region or barrier and which is divided into a plurality of stages. The first stage of the primary section is an input stage 14 which supplies a signal to a voltage sensing stage 18. The input stage 14 includes a load which, in this embodiment is preferably a resistor $R_1$ placed in series with either the tip or ring wire of the telephone line so that current will flow through the resistor $R_1$ when one of the plural terminal devices connected across the tip and ring terminals is in use.

The voltage sensing stage 18 can employ a variety of devices, as known to those of ordinary skill in the art, to measure current in the resistor $R_1$ but, in the preferred embodiment, voltage sensing stage 18 comprises a comparator connected across resistor $R_1$ for detecting a change in the voltage drop thereacross, corresponding to a change in the line current flowing through $R_1$, i.e. during an off-hook condition such as when a terminal device is in use. The comparator is formed of two operational amplifiers U1A and U1B, each connected in an opposite sense across the resistor $R_1$ as shown. Operational amplifier U1A is biased by a feedback resistor $R_3$ and input resistors $R_2$, $R_4$ which connect to opposite ends of resistor $R_1$. Similarly, operational amplifier U1B is biased by feedback resistor $R_6$ and input resistors $R_5$, $R_7$ which connect to the opposite ends of resistor $R_1$.

The operational amplifiers U1A and U1B are powered by a voltage $V_{DD}$ but, for reasons explained hereinabove and as dictated by the specifications of certain telephone communication systems, $V_{DD}$ cannot be derived or obtained from the tip or ring wires connected to the primary section of the circuit. Thus, in a manner more fully described below, operational amplifiers U1A and U1B are driven by a voltage $V_{DD}$ that is indirectly supplied across the isolation barrier from the secondary section of the circuit 10. The outputs of the operational amplifiers are connected to respective diodes $D_1$ and $D_2$ and, depending on the direction of current flow through resistor $R_1$, the output of either U1A or U1B causes the respective diode $D_1$ or $D_2$ to conduct through a resistor $R_8$.

A coupling stage 22 is provided for communicating across the isolation barrier between the primary section of the circuit 10 containing the input stage 14 and the secondary section of the circuit 10 containing an output stage 26. The coupling stage 22 is preferably comprised of an optocoupler $U_2$ having an input section including a light emitting diode $D_6$ which optically drives the output section of optocoupler $U_2$ when an appropriate signal is provided thereto via resistor $R_8$. The output section of optocoupler $U_2$ typically includes a pair of transistors $Q_2$, $Q_3$, configured as a current amplifier.

As shown, the output section of optocoupler $U_2$ is powered by a source voltage of, e.g., five volts that is electrically isolated from the voltage sensing stage 18 and which may be obtained, for example, from a stepped down voltage derived from an electrical outlet connected to a power cord (not shown) which supplies operating power to the automatic terminal device. An output signal generated by the optocoupler $U_2$ is received by the output stage 26 having a transistor $Q_1$ and, specifically, at the base terminal of transistor $Q_1$. Transistor $Q_1$ has its emitter terminal connected to one end of a resistor $R_9$, with the other end tied to a 0 volt reference terminal, and its collector terminal is connected to the voltage source. A resulting output signal is taken from the emitter terminal of transistor $Q_1$ and output from the circuit 10 at terminal X. When an output signal exceeding the threshold voltage of $Q_1$ is provided to its base terminal from the output of optocoupler $U_2$, transistor $Q_1$ will turn on and pull output terminal X to its "high" state or value, representing a current detect condition through resistor $R_1$.

As explained above, operational amplifiers U1A and U1B cannot be powered by voltage or current drawn from the line under observation because the necessary voltage or current may exceed the maximum allowed by the telephone communication system. Although the necessary operating voltage may be provided by a simple battery cell connected to the voltage sensing stage 18, the limited life of battery cells makes their use for this application impractical. Instead, the circuit 10 includes a powering stage 30 which generates the required voltage $V_{DD}$ from the voltage source. The so-generated voltage $V_{DD}$ powers the voltage sensing stage 18 while maintaining electrical isolation between the voltage source on the secondary side of the circuit 10 and the voltage sensing stage 18 on the primary side of the circuit.

The powering stage 30 is formed of a photodiode array $U_3$ that is positioned across the isolation barrier. The photodiode array $U_3$ has a light-emitting diode $D_3$ at its input stage. The cathode of LED $D_3$ is connected to the zero voltage line and the anode of $D_3$ is connected to a resistor $R_{10}$ which, in turn, is connected to the voltage source for activating diode $D_3$. Thus, as presently preferred and shown in the FIGURE, photodiode $D_3$ is always forward biased and, therefore, is always in its conductive state. Nonetheless, as an alternative arrangement a switch may be employed for providing diode $D_3$ with the forward biasing voltage only when the circuit 10 is to be used. In addition, and in another preferred embodiment, the voltage source is isolated from coupling stage 22 and output stage 26 as well as from voltage sensing stage 18.

When photodiode $D_3$ is activated (i.e. forward biased), an optical signal is transmitted across the isolation barrier and received by an output stage of photodiode array $U_3$ which is comprised of serially connected photodiodes $D_4$, $D_5$. The total voltage drop across these diodes generates the required voltage $V_{DD}$ for powering the operational amplifiers U1A and U1B of the voltage sensing stage 18 located on the primary side or section of the circuit 10.

The presently preferred values and identifying indicia of the components in the circuit 10 are:

| | |
|---|---|
| $R_1$ | 4.7 Ω |
| $R_2$ | 10 kΩ |
| $R_3$ | 510 kΩ |
| $R_4$ | 10 Ω |
| $R_5$ | 10 kΩ |
| $R_6$ | 510 kΩ |
| $R_7$ | 10 Ω |
| $R_8$ | 2.2 kΩ |
| $R_9$ | 10 kΩ |
| $R_{10}$ | 120 Ω |
| U1A, U1B | TLC27L2 (operational amplifier) |
| $D_1$, $D_2$ | IN4148 |
| $U_2$ | TLP127 (optical coupler) |
| $U_3$ | TLP19O (photodiode array) |

In practice, the circuit 10 may be located or incorporated in an automatic terminal device, such as a facsimile machine, which shares a telephone line with another terminal device such as a telephone. If the telephone is off-hook while a user attempts to send a facsimile transmission with a facsimile machine connected to the same telephone line and containing the circuit 10, before the facsimile machine accesses the common line to initiate a call and/or transmit data the operational amplifiers U1A and U1B of voltage sensing stage 18 will detect a voltage drop across resistor $R_1$, indicating current flow through the resistor. Depending on the polarity of the voltage drop across $R_1$—which is a function of the direction of current flow therethrough—one of the operational amplifiers U1A and U1B will output a positive signal. If this positive signal exceeds the combined forward bias voltages of the light emitting diode $D_6$ in optocoupler $U_2$ and the diode $D_1$ or $D_2$ connected to the activated operational amplifier, then $D_6$ will turn on.

When diode $D_6$ turns on, the optical signal emitted therefrom activates transistors $Q_2$, $Q_3$ in the output stage of optocoupler $U_2$ and the resulting output signal activates transistor $Q_1$ and pulls output terminal X to its high state, indicating a line current detection or, in other words, that the telephone line is already in use and therefore unavailable to the facsimile machine. A processor or the like (not shown) in the facsimile machine or modem may be used to sense the high state of output line X and to operatively deny access to the line until the low state on output line X is subsequently detected, indicating that the telephone line is no longer in use and is therefore available to the facsimile machine.

As will now be appreciated, inclusion of the detector circuit 10 in an automatic terminal device allows multiple devices to be connected to a common line while complying with the specifications and requirements of certain telephone systems as, for example, the systems presently used in Germany and Austria. For use in such systems, the circuit 10 advantageously utilizes a series resistor $R_1$ having a resistance of only 4.7 ohms or less, i.e. substantially lower than the series resistance of the reed relays which are employed by prior art techniques of line current detection. In addition, the voltage sensing stage 18 of the present invention is not powered by voltage or current obtained from the telephone line which is connected to the primary side of the circuit. Instead, the voltage sensing stage 18 is indirectly powered via powering stage 30 from a voltage provided or originating from the isolated secondary side of the circuit and communicated across the isolation barrier. Thus, electrical isolation is maintained between the primary and secondary sides of the circuit 10 while the required primary side components are powered from voltage $V_{DD}$ which is provided across the isolation barrier from the secondary side of the circuit through photodiode array $U_3$.

Although it is generally contemplated that photodiode array $U_3$ in powering stage 30 will always remain on—i.e. that it be continually powered from the five-volt voltage source—as an alternative the voltage source can be switched on or connected to the secondary side of the array $U_3$ only when current detection is required, as when a terminal device seeks to access the telephone line. In addition, while the utility of the circuit 10 has been described hereinabove with specific reference to telephone lines and communication systems, it should be readily apparent and appreciated that the circuit can likewise be used to detect a current flow or voltage in a wide variety of other applications, and particularly those having stringent maximum voltage and/or current loading or operating or isolation requirements. For example, the circuit 10 may be employed in medical equipment where highly sensitive devices are used in an electrically-isolated environment, for safety reasons. For such applications, the circuit 10 may be employed to detect if another device on the line is in use and to signal to the remaining devices to stand by if a flow of current is detected. Still other applications and utilities will be readily apparent from the instant disclosure to those of ordinary skill in the art.

Thus, while there have been shown and described and pointed out fundamental novel features of the invention as applied to a currently preferred embodiment thereof, it will be understood that various omissions and substitutions and changes in the form and details of the apparatus illustrated, and its operation, may be made by those skilled in the art without departing from the spirit of the invention. For example, other voltage or current sensing means in lieu of the depicted comparator arrangement of voltage sensing means 18 may be employed within the intended scope of the present invention. In addition, instead of utilizing transistor $Q_1$ in the output stage 26 of the circuit 10, other means or arrangements may be employed for switching output terminal X between a high and low state to indicate a current detect and no-current detect condition, respectively. It is also expressly intended that all combinations of those elements which perform substantially the same functions in substantially the same way to achieve the same results are within the scope of the invention. It is the intention, therefore, to be limited only as indicated by the scope of the claims appended herewith.

What is claimed is:

1. A minimally invasive detection device for detecting a current flow through an electric conductor without appreciably loading the conductor, said detection device comprising:

a load connected in series with the electrical conductor for developing a voltage differential across said load when current flows through said conductor;

powered means for sensing said voltage differential across said load and for generating a sensing signal in response to said sensing of a predetermined voltage detected across said load;

an output electrically isolated from said load and said sensing means across an electrical isolation barrier defining a primary side including said load and said sensing means and a secondary side including said output, said isolation barrier separating said primary and secondary sides to prevent direct electrical contact between said primary and secondary sides;

means for communicating said sensing signal to said output across said isolation barrier while maintaining said electrical isolation between said sensing means and said output;

means on said secondary side for supplying an operating voltage; and means for powering said sensing means using said operating voltage from said supplying means while maintaining electrical isolation between said supplying means and said sensing means by communicating said operating voltage to said sensing means across said isolation barrier.

2. The device of claim 1, wherein said load comprises a resistor.

3. The device of claim 2, wherein said communicating means is connected to said supplying means for receiving operating voltage from said supplying means.

4. The device of claim 3, wherein said powering means comprises a photodiode array positioned across said isolation barrier.

5. The device of claim 1, wherein said powering means comprises a photodiode array positioned across said isolation barrier.

6. The device of claim 4, wherein said communicating means comprises an optocoupler having an input end for receiving said sensing signal and an output end for amplifying said sensing signal and for outputting said amplified signal to said output.

7. The device of claim 1, wherein said communicating means comprises an optocoupler having an input end for receiving said sensing signal and an output end for amplifying said sensing signal and for outputting said amplified signal to said output.

8. The device of claim 6, wherein said communicating means further comprises a transistor connected between said optocoupler, said output and said supplying means for providing a high level signal to said output in response to said sensing signal.

9. The device of claim 1, wherein said communicating means further comprises a transistor connected between said optocoupler, said output and said supplying means for providing a high level signal to said output in response to said sensing signal.

* * * * *